(12) United States Patent
Lu et al.

(10) Patent No.: US 9,195,135 B2
(45) Date of Patent: Nov. 24, 2015

(54) METHOD FOR MASK FABRICATION AND REPAIR

(71) Applicant: Taiwan Semiconductor Manufacturing Company, Ltd., Hsin-Chu (TW)

(72) Inventors: Yen-Cheng Lu, New Taipei (TW); Shinn-Sheng Yu, Hsinchu (TW); Jeng-Horng Chen, Hsin-Chu (TW); Anthony Yen, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 200 days.

(21) Appl. No.: 13/946,630

(22) Filed: Jul. 19, 2013

(65) Prior Publication Data

US 2014/0272680 A1 Sep. 18, 2014

Related U.S. Application Data

(60) Provisional application No. 61/789,100, filed on Mar. 15, 2013.

(51) Int. Cl.
*G03F 1/72* (2012.01)
*G03F 1/22* (2012.01)

(52) U.S. Cl.
CPC ... *G03F 1/72* (2013.01); *G03F 1/22* (2013.01)

(58) Field of Classification Search
CPC ..................................... G03F 1/72; G03F 1/22
USPC ............................................................ 430/5
See application file for complete search history.

(56) References Cited

U.S. PATENT DOCUMENTS

| 6,821,682 | B1 | 11/2004 | Stearns et al. | |
| 2008/0318138 | A1 | 12/2008 | Holfeld | |
| 2009/0029266 | A1* | 1/2009 | Schenker et al. | 430/5 |

FOREIGN PATENT DOCUMENTS

WO WO 00/34828 6/2000

* cited by examiner

*Primary Examiner* — Stephen Rosasco
(74) *Attorney, Agent, or Firm* — Haynes and Boone, LLP

(57) ABSTRACT

A method for repairing a phase-defect region in a patterned mask for extreme ultraviolet lithography (EUVL) is disclosed. A patterned mask for EUVL is received. The patterned mask includes an absorptive region having an absorption layer over a defect-repairing-enhancement (DRE) layer, a reflective region having the DRE layer without the absorption layer on top of it, a defect and a phase-defect region resulting from the defect and intruding the reflective region. A location and a shape of the phase-defect region is determined. A portion or portions of the DRE layer in the reflective region is removed according to the location and the shape of the phase-defect region to compensate the effect of the phase-defect region.

20 Claims, 7 Drawing Sheets

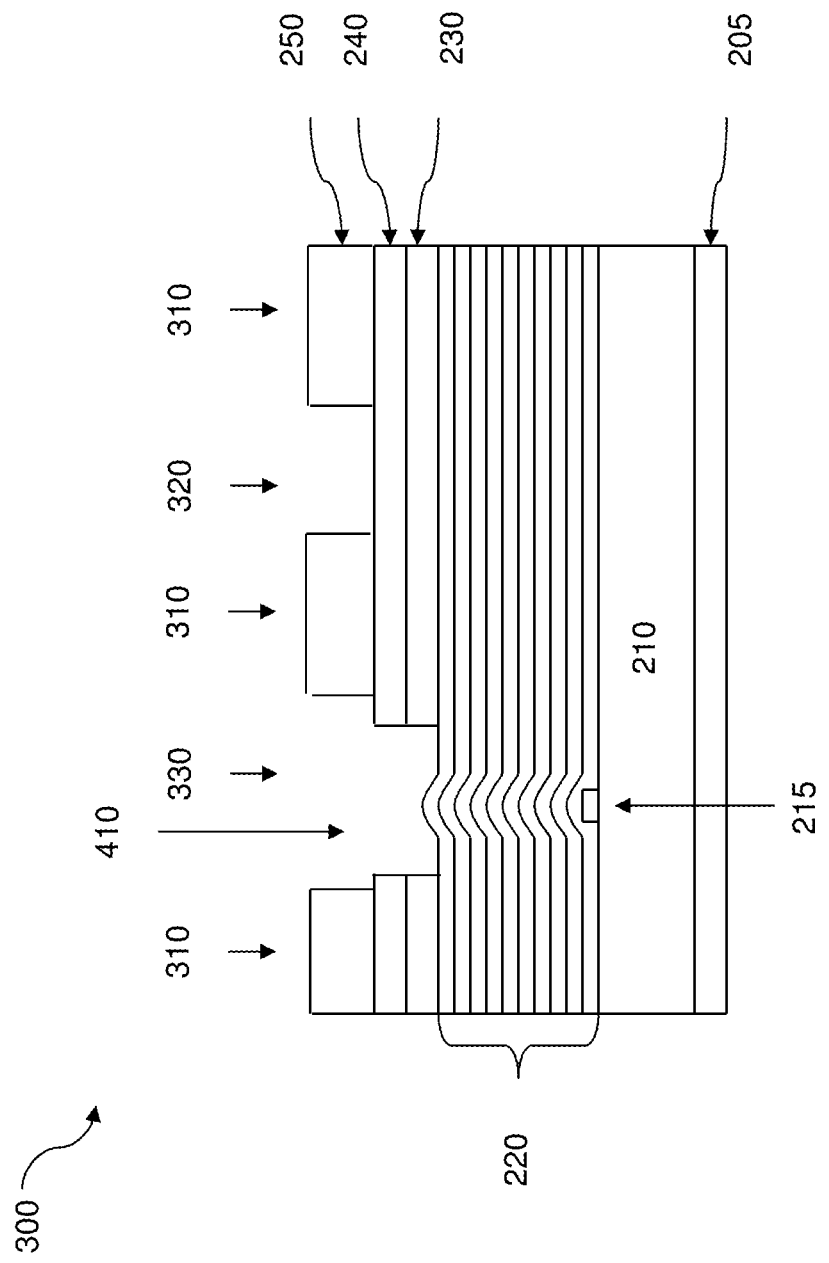

METHOD FOR MASK FABRICATION AND REPAIR

This patent claims the benefit of U.S. Ser. No. 61/789,100 filed Mar. 15, 2013, which is hereby incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing. For these advances to be realized, similar developments in IC processing and manufacturing are needed. For example, the need to perform higher resolution lithography processes grows. One lithography technique used to address this need is extreme ultraviolet lithography (EUVL). Other techniques include X-Ray lithography, ion beam projection lithography, electron beam projection lithography, and multiple electron beam maskless lithography.

EUVL employs scanners using light in the extreme ultraviolet (EUV) region, having a wavelength of about 1-100 nm. Some EUV scanners provide 4× reduction projection printing, similar to some optical scanners, except that the EUV scanners use reflective rather than refractive optics, i.e., mirrors instead of lenses. EUV scanners provide the desired pattern on an absorption layer ("EUV" mask absorber) formed on a reflective mask. Masks used in EUVL presents new challenges. For example, a multi-layer (ML) structure is used in an EUVL mask and a microscopic non-flatness (caused by a defect, for example) on a surface of the substrate of the EUV mask may deform the films deposited subsequently thereon. When an incident light is reflected from a deformed region, it may experience a phase difference with respect to a light reflected from a normally formed region. Sometimes a defect introduces a phase difference close to 180°, referred to as a phase defect. A phase defect may affect print fidelity and result in severe pattern distortion on a substrate. It is desired to provide an efficient and a feasible method to reduce and/or mitigate the printability of phase defects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3 to 5 illustrate cross sectional views of one embodiment in various stages for repairing an EUV mask according to various aspects of the present disclosure.

DETAILED DESCRIPTION

Figure 1:
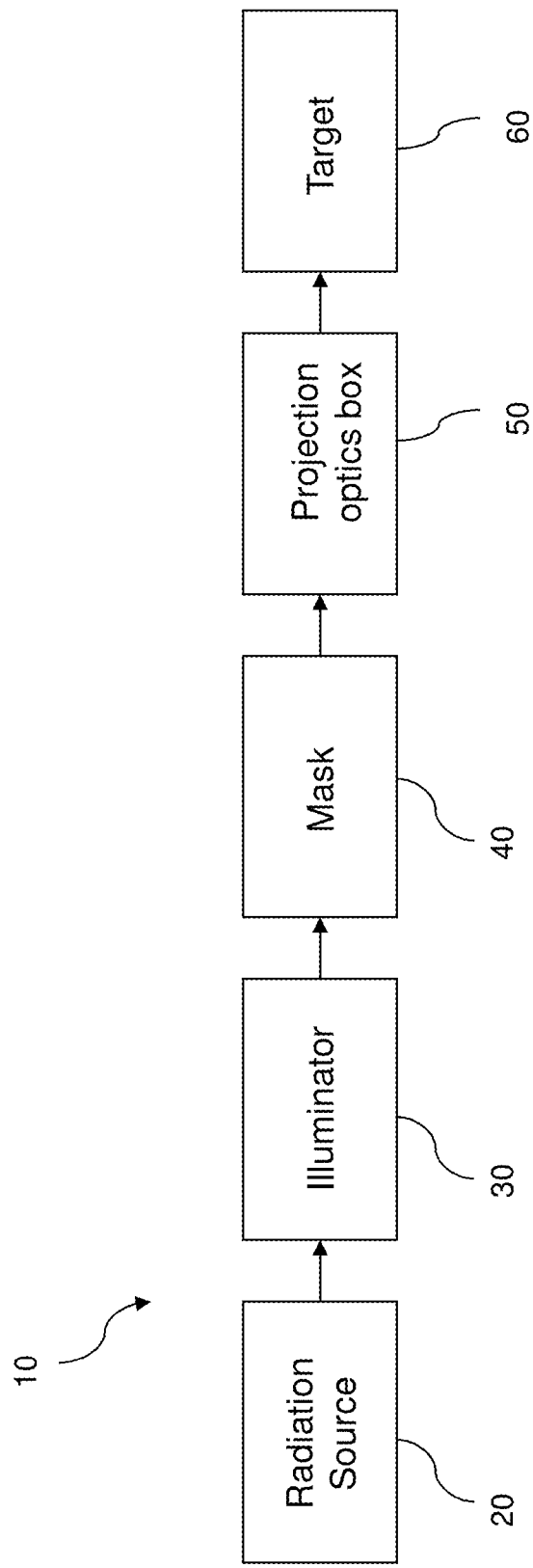
FIG. 1 is a block diagram of a lithography process for implementing one or more embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "over," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Referring to FIG. 1, an EUV lithography system and process 10 that may benefit from one or more embodiments of the present invention is disclosed. The EUV lithography process 10 employs an EUV radiation source 20 having a wavelength of about 1-100 nm.

The EUV lithography process 10 also employs an illuminator 30. The illuminator 30 may comprise refractive optics, such as a single lens or a lens system having multiple lenses (zone plates) and/or reflective optics, such as a single mirror or a mirror system having multiple mirrors in order to direct light from the radiation source 20 onto the mask 40. In the EUV wavelength range, reflective optics are employed generally. Refractive optics, however, can also be realized by, e.g., zone plates.

The EUV lithography process 10 also employs a mask 40 (in the present disclosure, the term of mask, photomask, and reticle are used to refer to the same item). The mask 40 can be a transmissive mask or a reflective mask. In the present embodiment, the mask 40 is a reflective mask such as described in further detail below. The mask 40 may incorporate other resolution enhancement techniques such as phase-shifting mask (PSM) and/or optical proximity correction (OPC).

The EUV lithography process 10 also employs a projection optics box (POB) 50. The POB 50 may have refractive optics or reflective optics. The radiation reflected from the mask 40

(e.g., a patterned radiation) is collected by the POB 50. The POB 50 may include a magnification of less than one (thereby reducing the patterned image included in the radiation).

The target 60 includes a semiconductor wafer with a photosensitive layer (e.g., photoresist or resist), which is sensitive to the EUV radiation. The target 60 may be held by a target substrate stage. The target substrate stage provides control of the target substrate position such that the image of the mask is scanned onto the target substrate in a repetitive fashion (though other lithography methods are possible).

The following description refers to the mask 40 and mask fabrication and repairing processes. The mask fabrication and repairing processes include three steps: a blank mask fabrication process, a mask patterning process, and a mask repairing process. During the blank mask fabrication process, a blank mask is formed by depositing suitable layers (e.g., multiple reflective layers) on a suitable substrate. The blank mask is patterned during the mask patterning process to have a design pattern for a corresponding layer of an integrated circuit (IC) device (or chip). A mask repairing process may be implemented before or after the mask patterning process to mitigate the printability of defects on the blank mask or on the patterned mask. After repairing, the patterned mask is then used to transfer the design pattern onto a semiconductor wafer. The design pattern can be transferred over and over onto multiple wafers through various lithography processes. Several masks (for example, a set of 15 to 30 masks) may be used to construct a complete IC device.

In general, various masks are fabricated for use in various processes. Types of EUV masks include binary intensity masks (BIM) and phase-shifting masks (PSM). An example BIM includes an almost totally absorptive region (also referred to as a dark region) and a reflective region. In the opaque region, an absorber is present and an incident light is almost fully absorbed by the absorber. In the reflective region, the absorber is removed and the incident light is reflected by a multilayer (ML). A PSM includes an absorptive region and a reflective region. The phase difference (generally) 180° between a portion of a light reflected from the absorptive region and a portion of the light reflected from the reflective region enhances resolution and image quality. The PSM can be an attenuated PSM (AttPSM) or an alternating PSM (AltPSM). An AttPSM usually has a reflectivity of 2%-15% from its absorber, while an AltPSM usually has a reflectivity of larger than 50% from its absorber.

Figure 2:
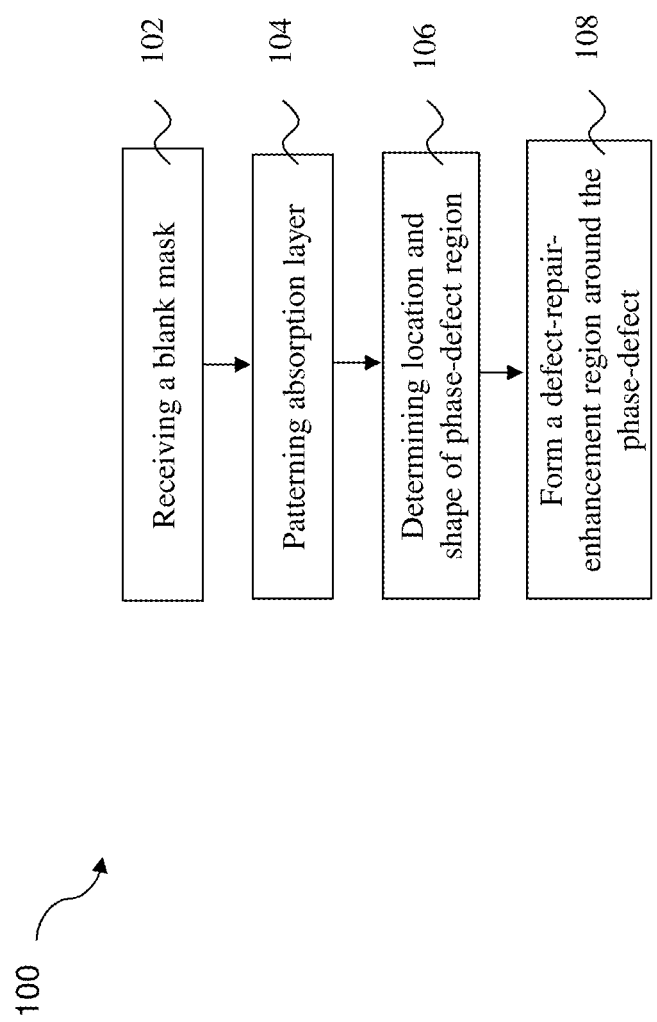
FIG. 2 is a flow chart of an example method for repairing an EUV mask according to various aspects of the present disclosure.
Figure 3:
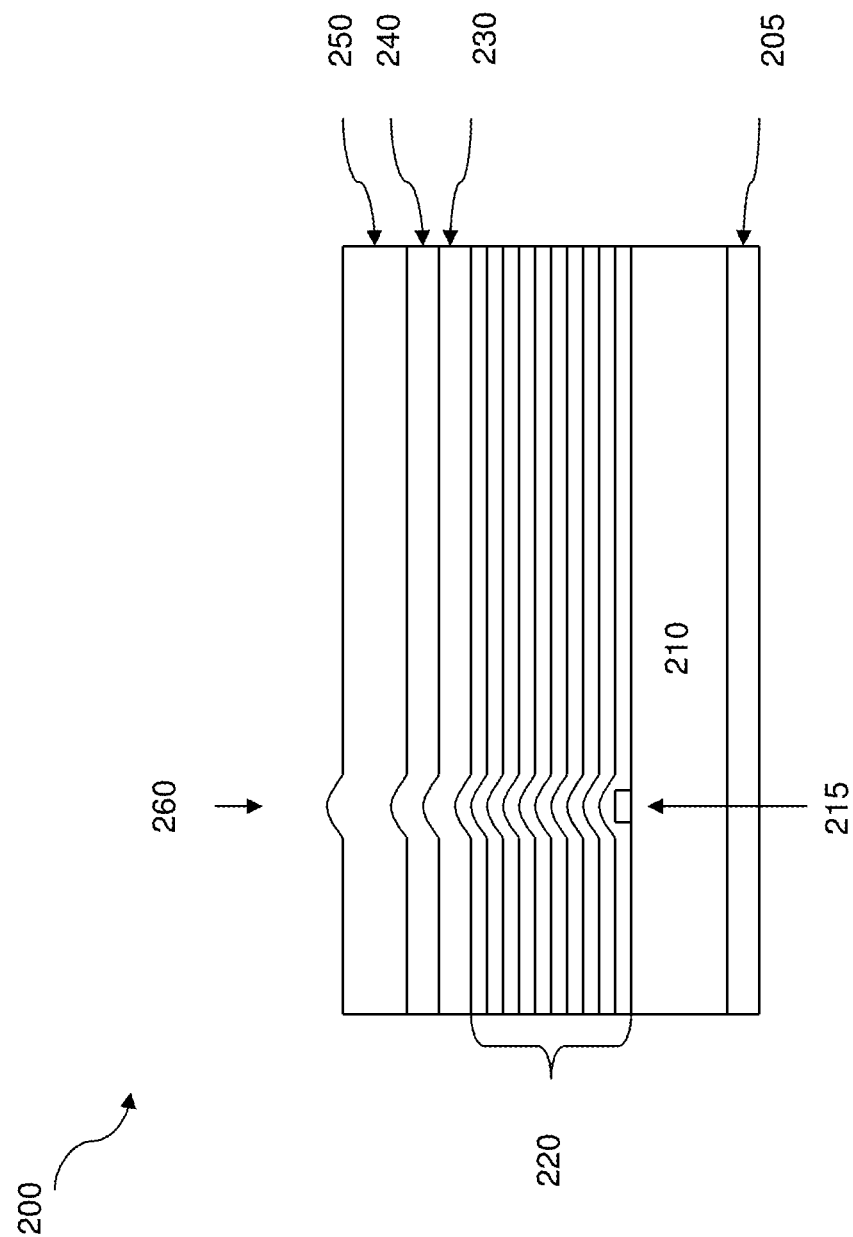
Figure 4:
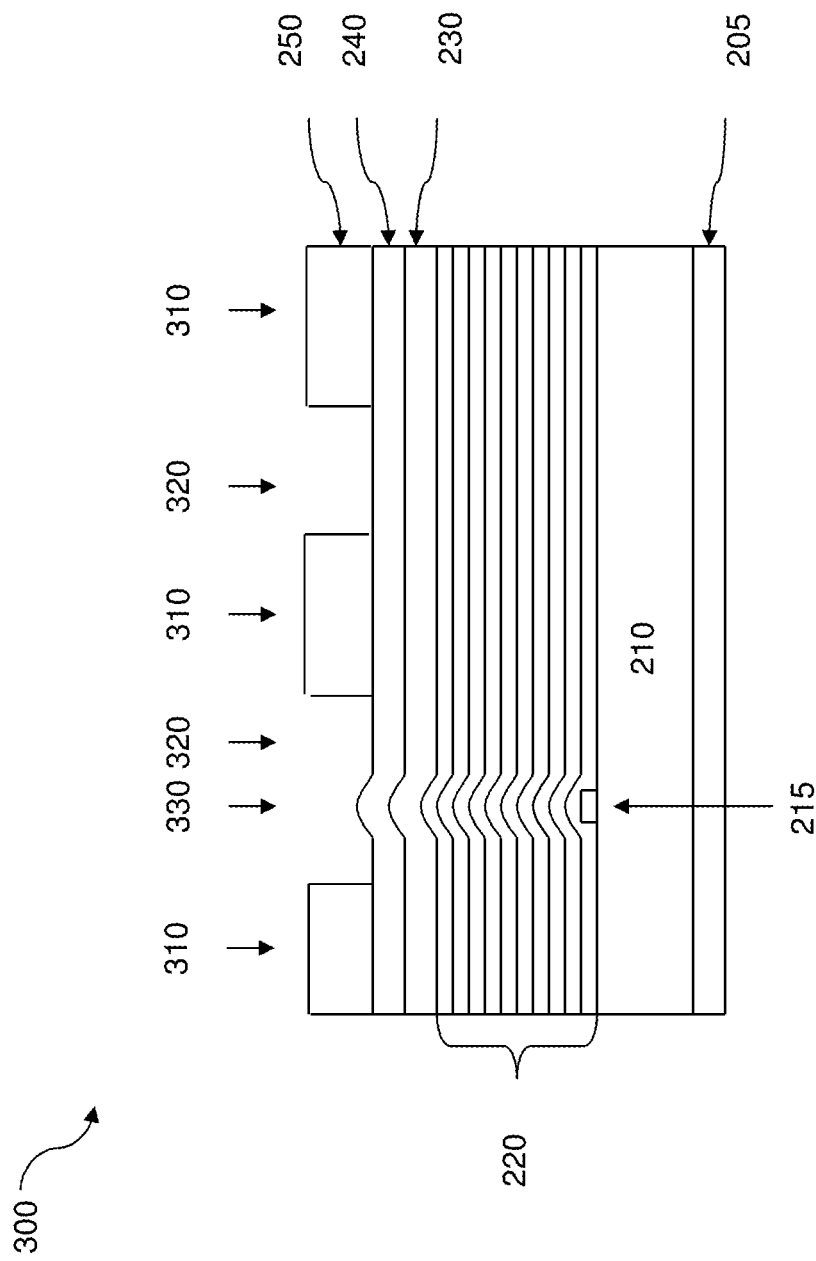
Figure 6A:
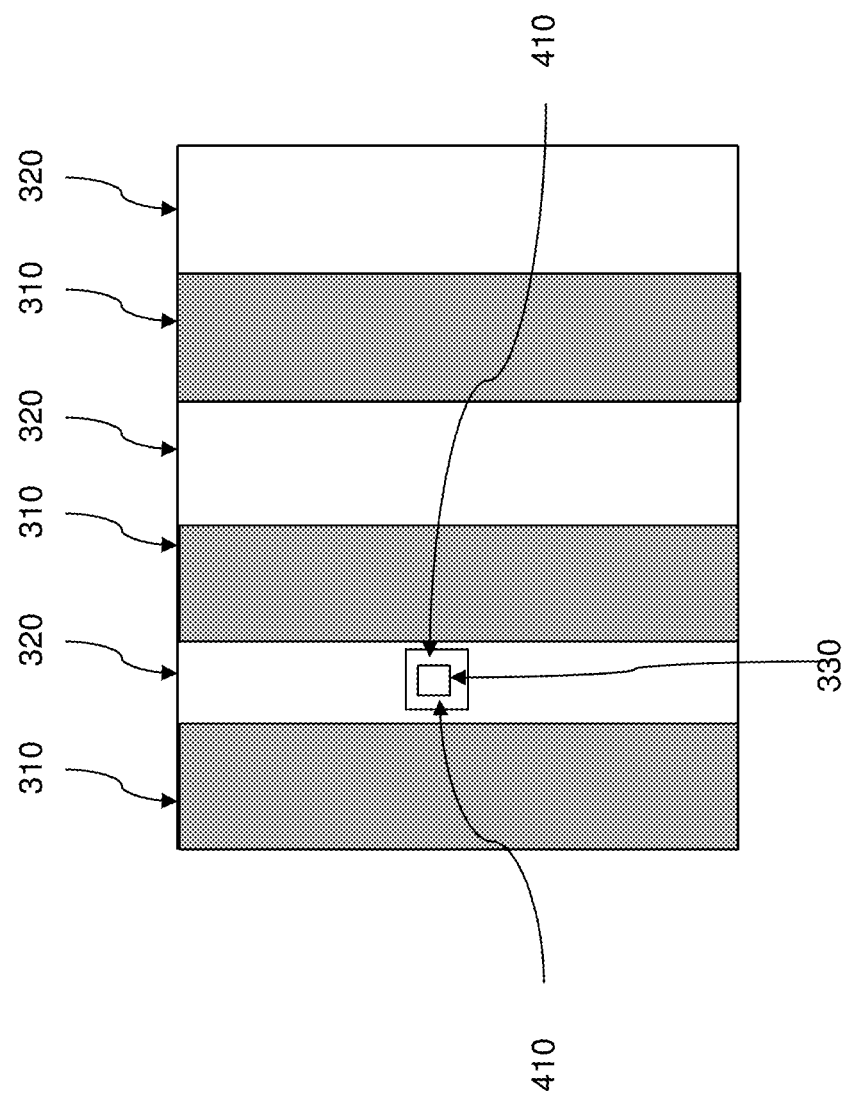
FIGS. 6A and 6B are diagrammatic top views of a patterned EUV mask in various stages according to various aspects of the present disclosure.
Figure 6B:
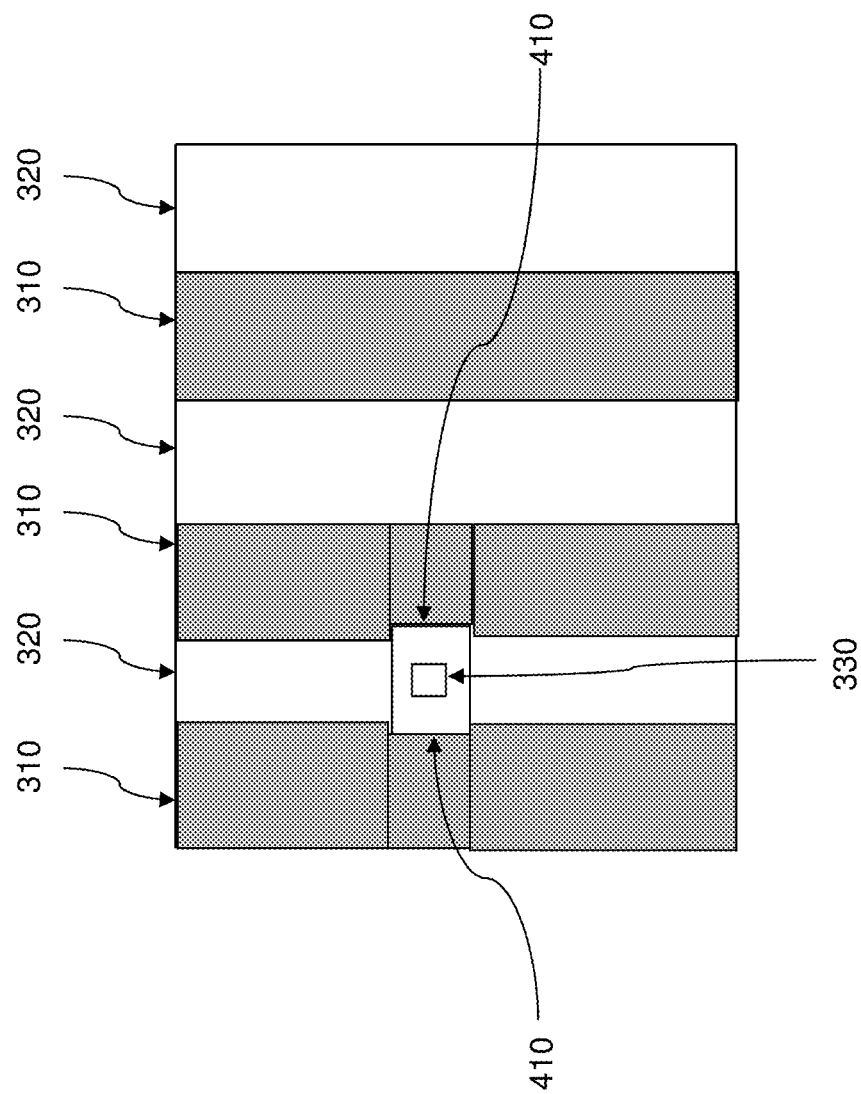

FIG. 2 is a flowchart of a method 100 of fabricating and repairing an EUV mask constructed according to aspects of the present disclosure. FIG. 3 is a cross-sectional view of one embodiment of a blank mask 200 at various fabrication stages of the method 100. FIGS. 4 and 5 are cross-sectional views of one embodiment of a patterned EUV mask 300 at various fabrication stages of the method 100. FIGS. 6A and 6B are diagrammatic top views of a patterned EUV mask at various repairing stages of the method 100.

Referring to FIGS. 2 and 3, the method 100 begins at step 102 by receiving a blank mask 200. The blank mask 200 includes a substrate 210 made of low thermal expansion material (LTEM). The LTEM material may include $TiO_2$ doped $SiO_2$, and/or other low thermal expansion materials known in the art. The LTEM substrate 210 serves include molybdenum-beryllium (Mo/Be) film pairs, or any two materials or two material combinations to minimize image distortion due to mask heating. In addition, a conductive layer 205 may be deposited under (as shown in the figure) the LTEM substrate 210 for the electrostatic chucking purpose. In an embodiment, the conductive layer 205 includes chromium nitride (CrN), though other compositions are possible.

The blank mask 200 also includes a reflective multilayer (ML) 220 deposited over the LTEM substrate 210. The reflective ML 220 includes a plurality of film pairs, such as molybdenum-silicon (Mo/Si) film pairs (i.e., a layer of molybdenum over a layer of silicon in each film pair). The two constituent materials of the reflective ML are chosen to achieve a large difference in their refractive indices and small values in their extinction coefficients. The thickness of each layer of the reflective ML 220 depends on the wavelength and the angle of incidence of the incident light. For a specified angle of incidence, the thickness of each layer of the reflective ML 220 is adjusted to achieve maximal constructive interference for light reflected at different interfaces of the reflective ML 220. A typical number of film pairs is 20-80, however any number of film pairs is possible. In an embodiment, the reflective ML 220 includes forty Mo/Si film pairs. Each Mo/Si film pair has a thickness of about 7 nm, e.g., about 3 nm for Mo and about 4 nm for Si. In this case, a reflectivity of about 70% is achieved.

Referring specifically to FIG. 3, in the present embodiment, the blank mask 200 includes at least one defect 215. The defect 215 includes a bump or a pit on the surface of the LTEM substrate 210 (beneath the reflective ML 220) or embedded in the reflective ML 220. The defect 215 may form during fabricating the LTEM substrate 210, the reflective ML 220, or any other process. The defect 215 may cause local deformation of all subsequent layers over it to form a deformation region 260.

In the present embodiment, a defect-repairing-enhancement (DRE) layer 230 is formed over the reflective ML 220. The DRE layer 230 includes any suitable absorptive materials with a quite thin thickness. In one embodiment, the DRE layer 230 includes germanium (Ge) having a thickness of 7 nm. In another embodiment, a Ge DRE layer 230 has a thickness in a range from 4 nm to 10 nm.

A buffer layer 240 is formed over the DRE layer 230 to act as an etch stop layer in a patterning or repairing process of an absorption layer, which will be described later. The buffer layer 240 has different etching characteristics from the future absorption layer. The buffer layer 240 includes ruthenium (Ru), Ru compounds such as RuB, RuSi, chromium (Cr), Cr oxide, and Cr nitride.

An absorption layer 250 is formed over the buffer layer 240. In the present embodiment, the absorption layer 250 absorbs radiation in the EUV wavelength range projected onto a patterned mask. The absorption layer 250 includes multiple film layers with each film containing chromium, chromium oxide, chromium nitride, titanium, titanium oxide, titanium nitride, tantalum, tantalum oxide, tantalum nitride, tantalum oxynitride, tantalum boron nitride, tantalum boron oxide, tantalum boron oxynitride, aluminum, aluminum-copper, aluminum oxide, silver, silver oxide, palladium, ruthenium, molybdenum, other suitable materials, or mixture of some of the above. With a proper configuration of multiple film layers, the absorption layer 250 will provide process flexibility in a subsequent etching process by different etch characteristics of each film.

One or more of the layers 205, 220, 230, 240 and 250 may be formed by various methods, including a physical vapor deposition (PVD) process such as evaporation and DC magnetron sputtering, a plating process such as electrode-less plating or electroplating, a chemical vapor deposition (CVD) process such as atmospheric pressure CVD (APCVD), low pressure CVD (LPCVD), plasma enhanced CVD (PECVD), or high density plasma CVD (HDP CVD), ion beam deposition, spin-on coating, metal-organic decomposition (MOD), and/or other methods known in the art. The MOD is a deposition technique by using a liquid-based method in a non-vacuum environment. By using MOD, a metal-organic precursor, dissolved in a solvent, is spin-coated onto a substrate and the solvent is evaporated. A vacuum ultraviolet (VUV) source is used to convert the metal-organic precursors to constituent metal elements.

Referring to FIGS. 2 and 4, the method 100 proceeds to step 104 by patterning the absorption layer 250 to form the design layout patterned EUV mask 300. A patterning process may include lithography and etching processes. A lithography process may include resist coating (e.g., spin-on coating), soft baking, mask aligning, exposure, post-exposure baking, developing the resist, rinsing, drying (e.g., hard baking), other suitable processes, and/or combinations thereof. The exposure is accomplished by electron beam direct writing or multiple electron beam direct writing. Next, an etching process is performed to remove portions of the absorption layer 250. The etching process may include dry (plasma) etching, wet etching, and/or other etching methods.

The patterned EUV mask 300 includes absorptive regions 310 and reflective regions 320. At least one of the reflective regions 320 includes a defect region 330. The defect region 330, where the aerial image may be unacceptably anomalous, is due to the presence of the deformation region 260 caused by the defect 215 beneath or embedded in the ML 220. The defect region 330 may have a small impact on the amplitude of a light ray reflected from the reflective region 320 where the defect region 330 is located. However, it can have a large impact on the phase of the light ray. This is the reason why the defect region 330 is referred to as the phase-defect region 330. For example, assuming conformal deposition of all subsequent layers, a defect 215 of height or depth of one fourth of the wavelength of the radiation source 20 can cause a 180° phase error for a light ray reflected from this region. In fact, a relatively small fraction of the 180° phase error, e.g., 30°, can have a prominent impact on the lithographic process window or even cause patterning fidelity problems. Therefore, a defect-free LTEM substrate 210 and a defect-free reflective ML 220 are desired. However, this puts constraints in a mask fabrication and may make the mask fabrication become more expensive. The present disclosure offers a unique approach to reduce impacts of the phase-defect region.

The method 100 proceeds to step 106 by determining a location and a shape of the phase-defect region 330. The location and shape of the phase-defect region 330 may be detected by atomic force microscope (AFM), aerial image metrology system (AIMS™, by Carl Zeiss) or other defect metrology tools. In the present embodiment, such two-dimensional (2D) information as location and shape of the phase-defect region 330 is sufficient. The 2D information is in a plane which is parallel to the surface of the LTEM substrate 210. A detailed three-dimensional (3D) profile of the phase-defect region 330, which is necessary for a more accurate determination of the resultant phase error, can be used in an alternative embodiment.

Referring to FIGS. 2, 5, 6A and 6B, the method 100 proceeds to step 108 by removing, in the reflective region 320 having the phase-defect region 330, a portion of the DRE layer 230 as well as the overlying buffer layer 240, near the phase-defect region 330 to form a DRE-layer-absent region 410 (hereinafter referred to as the DRE region). The DRE region 410 is formed by a suitable technique, such as focused-ion-beam etching or focused-electron-beam-induced etching. The DRE region 410 provides additional reflected light rays to compensate for intensity loss caused by the phase-defect region 330 so that the aerial image is restored on the target 60 (such as a wafer). The DRE region can be extended by removing a portion or portions of the absorbing layer adjacent to the reflective region 320, where the phase defect region 330 locates, to allow for more intensity loss compensation. Alternatively, when the phase-defect region 330 causes a large phase error, e.g., a phase error of 180°, the DRE region 410 may need to be form in an appropriate region which is not near the phase-defect region 330. The buffer layer and the DRE layer underneath the removed absorption layer can also be removed. In the present embodiment, the extent of the DRE region 410 is related to the location and the shape of the phase-defect region 330. Alternatively, the extent of the DRE region 410 can be determined by a feedback loop involving aerial image or resist image metrology (by AIMS for a mask or by SEM for a wafer) and mask repair. Simulation can also be employed if an accurate model is provided.

Based on the above, it can be seen that the present disclosure offers a mask fabrication and mask repair method. The method reduces printability of a phase-defect region by forming a defect-repair-enhancement (DRE) region to compensate for intensity loss caused by the phase-defect region. The DRE region is formed by removing, in the reflective region, a portion of the DRE layer near the phase-defect region in the patterned EUV mask. When the phase-defect region causes a large phase error, e.g., a phase error of 180°, the DRE region may need to be form in a region which is not near the phase-defect region. The DRE region can be extended by removing a portion or portions of the absorption layer in the absorptive region adjacent to the reflective region including the phase-defect region. The buffer layer and the DRE layer underneath the removed absorption layer can also be removed. The method requires such 2D information of the phase-defect region as a location and a shape. The method demonstrates capability to repair a phase-defect region with a larger height or depth. The method employs a quite straightforward local etching process with flexible shape capability. The method provides a mask repair method having broad applicability and simplicity.

The present disclosure provides a method for repairing a phase-defect region in a patterned mask for extreme ultraviolet lithography (EUVL). The method includes receiving a patterned mask for EUVL. The patterned mask includes an absorptive region having an absorption layer over a defect-repairing-enhancement (DRE) layer, a reflective region having the DRE layer without the absorption layer on top of it, a defect and a phase-defect region resulting from the defect and intruding the reflective region. The method also includes determining a location and a shape of the phase-defect region and removing a portion or portions of the DRE layer in the reflective region according to the location and the shape of the phase-defect region to compensate the effect of the phase-defect region.

In another embodiment, a mask repairing process includes receiving a mask for extreme ultraviolet lithography (EUVL). The mask includes a low thermal expansion material (LTEM) substrate having a first region and a second region, a reflective multilayer (ML) over the LTEM substrate in the first region and the second region, a defect-repairing-enhancement (DRE) layer over the reflective ML in the first region and the second region, an absorption layer over the DRE layer in the second region, a defect and a phase-defect region resulting from the defect and intruding the first region. The method also includes determining a location and a shape of the phase-defect region and removing a portion or portions of the DRE layer in the first region according to the location and the shape of the phase defect region to compensate the effect of the phase-defect region.

In yet another embodiment, a mask includes a low thermal expansion material (LTEM) substrate, a reflective multilayer (ML) over the surface of the LTEM substrate, a defect-repairing-enhancement (DRE) layer over the reflective ML, a patterned absorption layer over the DRE layer to create a reflective region and an absorptive region, a defect, a phase-defect region resulting from the defect and intruding the reflective region and a DRE region where the absorption layer and the DRE layer are removed near the phase-defect region.

The foregoing outlined features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for repairing a phase-defect region in a patterned mask for extreme ultraviolet lithography (EUVL), the method comprising:
   receiving a patterned mask for EUVL, the patterned mask including:
      an absorptive region having an absorption layer over a defect-repairing-enhancement (DRE) layer;
      a reflective region having the DRE layer without the absorption layer on top of it;
      a defect; and
      a phase-defect region resulting from the defect and intruding the reflective region;
   determining a location and a shape of the phase-defect region;
   removing a portion of the DRE layer in the reflective region to form an opening in the DRE layer, wherein the location and shape of the opening is determined according to the location and the shape of the phase-defect region to compensate the effect of the phase-defect region.

2. The method of claim 1, further comprising:
   prior to the removing the portion of the DRE layer in the reflective region, removing a portion of a buffer layer overlying the portion of the DRE layer in the reflective region;
   wherein the patterned mask includes:
      a low thermal expansion material (LTEM) substrate;
      a reflective multilayer (ML) over a surface of the LTEM substrate;
      a conductive layer over an opposite surface of the LTEM substrate;
      the DRE layer over the reflective ML;
      the buffer layer over the DRE layer; and
      the absorption layer over the buffer layer.

3. The method of claim 1, wherein the defect is of bump-type with height larger than about 1 nm.

4. The method of claim 1, wherein the defect is of pit-type with depth larger than about 1 nm.

5. The method of claim 1, wherein the DRE layer includes germanium (Ge) having a thickness from about 4 nm to about 10 nm.

6. The method of claim 1, wherein the DRE layer is removed by a local etching process.

7. The method of claim 1, further comprising:
   removing a portion or portions of the absorption layer adjacent to the reflective region having the phase-defect region to further compensate the effect of the phase-defect region.

8. The method of claim 7, further comprising:
   removing a portion or portions of the DRE layer underneath the removed absorption layer to further compensate the effect of the phase-defect region.

9. The method of claim 1, wherein the shape and location of the phase-defect region is determined by atomic force microscope (AFM).

10. The method of claim 1, wherein the shape and location of the phase-defect region is determined by aerial image measurement system (AIMS).

11. A mask repairing process comprising:
   receiving a mask for extreme ultraviolet lithography (EUVL), the mask including:
      a low thermal expansion material (LTEM) substrate having a first region and a second region;
      a reflective multilayer (ML) over the LTEM substrate in the first region and the second region;
      a defect-repairing-enhancement (DRE) layer over the reflective ML in the first region and the second region;
      an absorption layer over the DRE layer in the second region;
      a defect; and
      a phase-defect region resulting from the defect and intruding the first region;
   determining a location and a shape of the phase-defect region;
   removing a portion of the DRE layer in the first region to form a first opening in the DRE layer according to the location and the shape of the phase defect region; and
   removing a portion of the absorption layer in the second region to form a second opening in the absorption layer according to the location and the shape of the phase defect region.

12. The method of claim 11, wherein the defect is of bump-type with height larger than about 1 nm.

13. The method of claim 11, wherein the defect is of pit-type with depth larger than about 1 nm.

14. The method of claim 11, wherein the DRE layer includes germanium (Ge) having a thickness from about 4 nm to about 10 nm.

15. The method of claim 11, further comprising:
   removing another portion of the DRE layer in the second opening of the absorption layer to form a third opening in the DRE layer according to the location and the shape of the phase defect region.

16. The method of claim 15, wherein the third opening in the DRE layer has a width in a direction parallel to a top surface of the DRE layer different from a width of the second opening in the absorption layer in the direction.

17. A mask comprising:
   a low thermal expansion material (LTEM) substrate;
   a reflective multilayer (ML) over the surface of the LTEM substrate;
   a defect-repairing-enhancement (DRE) layer over the reflective ML;
   a patterned absorption layer over the DRE layer to create a reflective region and an absorptive region;
   a defect;
   a phase-defect region resulting from the defect and intruding the reflective region; and a opening in the DRE layer in the reflective region, wherein the location and shape of the opening is determined by the phase-defect region.

18. The mask of claim 17, wherein the DRE layer includes germanium (Ge) having a thickness from about 4 nm to about 10 nm.

19. The mask of claim 17, wherein a vertical dimension of the defect is larger than about1 nm.

20. The mask of claim 17, further comprising:
a buffer layer disposed over the DRE layer, wherein the patterned absorption layer is disposed over the buffer layer, and wherein the buffer layer has an opening overlying the opening in the DRE layer.

* * * * *